United States Patent
Schlösser et al.

(10) Patent No.: US 6,462,979 B2
(45) Date of Patent: Oct. 8, 2002

(54) INTEGRATED MEMORY HAVING MEMORY CELLS WITH MAGNETORESISTIVE STORAGE EFFECT

(75) Inventors: Till Schlösser, Dresden; Roland Thewes, Gröbenzell, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/799,626

(22) Filed: Mar. 5, 2001

(65) Prior Publication Data

US 2001/0026469 A1 Oct. 4, 2001

(30) Foreign Application Priority Data

Mar. 3, 2000 (DE) .......................................... 100 10 457

(51) Int. Cl.$^7$ .............................................. G11C 11/00
(52) U.S. Cl. ...................................... 365/158; 365/157
(58) Field of Search .................................. 365/158, 157

(56) References Cited

U.S. PATENT DOCUMENTS

| | | |
|---|---|---|
| 4,439,693 A | 3/1984 | Lucas et al. |
| 4,695,971 A | 9/1987 | Brookshire |
| 4,829,476 A | 5/1989 | Dupuis et al. |
| 4,922,126 A * | 5/1990 | Lowel ........................ 307/261 |
| 5,282,104 A | 1/1994 | Coutellier et al. |
| 6,351,408 B1 * | 2/2002 | Schwarzl et al. ........... 365/158 |

FOREIGN PATENT DOCUMENTS

WO        WO99/14760         3/1999

OTHER PUBLICATIONS

U.Tietze et al.: "Halbleiter–Schaltungstechnik" [semiconductor control technology], 9$^{th}$ ed., Springer verlag, Berlin, 1990, pp. 74, 75, 124, 125, 158–162, 502–505.

* cited by examiner

Primary Examiner—Huan Hoang
(74) Attorney, Agent, or Firm—Laurence A. Greenberg; Werner H. Stemer; Ralph E. Locher

(57) ABSTRACT

The integrated memory has memory cells with a magnetoresistive storage effect in a memory cell array in the form of a matrix. The memory cells are each connected between one of the column lines and one of the row lines. The column lines are each connected to a read amplifier for reading a data signal from a memory cell. The read amplifier has an operational amplifier with feedback, and a first control input connected to one of the column lines. A capacitor is connected between a second control input of the operational amplifier and a terminal for a supply potential and is used to compensate for any offset voltage at the control inputs of the operational amplifier. This allows a data signal which is to be read from one of the memory cells to be detected comparatively reliably.

6 Claims, 2 Drawing Sheets

INTEGRATED MEMORY HAVING MEMORY CELLS WITH MAGNETORESISTIVE STORAGE EFFECT

BACKGROUND OF THE INVENTION

Field of the Invention

The invention lies in the integrated technology field and pertains, more specifically, to an integrated memory having memory cells with a magnetoresistive storage effect, having a memory cell array which is in the form of a matrix and has column lines and row lines. The memory cells are each connected between one of the column lines and one of the row lines, in which the column lines are each connected to a read amplifier for reading a data signal from a corresponding memory cell, which has an operational amplifier with feedback, on which the read signal can be tapped off, and in which a first control input of the operational amplifier is connected to one of the column lines.

Memory cells with a magnetoresistive storage effect generally have variable-state ferromagnetic layers for storing data signals. This storage effect is generally referred to as the GMR (giant magnetoresistive) effect or TMR (tunneling magnetoresistive) effect. In this case, the electrical resistance of such a memory cell is dependent on the magnetization of the ferromagnetic layers.

A memory cell arrangement and its use as magnetic random access memory (referred to as MRAM) is described in the commonly assigned, copending patent application 09/528,159 (see German patent application DE 197 40 942). The memory cell configuration has row lines and column lines which run essentially parallel to one another, with the row lines running transversely with respect to the column lines. Memory cells with a magnetoresistive storage effect are provided, which are each connected between one of the row lines and one of the column lines and have a higher impedance than the row lines or the column lines. The column lines are each connected to a read amplifier for reading a data signal from one of the memory cells, via which the potential on the respective column line can be regulated at a supply or reference potential. The current which can be detected on the column line is measured for reading.

The read amplifier has an operational amplifier with feedback, on which an output signal can be tapped off. The non-inverting input of the operational amplifier is thereby connected to a reference potential. One of the column lines is connected to the inverting input. If, for example, the reference potential corresponds to a ground potential of the integrated memory, then the operational amplifier ensures that the potential on the column line is likewise essentially ground. The read amplifier is then also referred to as a 'virtual ground' read amplifier. The output signal from the operational amplifier is a measure of the resistance of the selected memory cell.

In an MRAM memory arranged in such a way, there are no diodes or transistors to connect the memory cells to the column lines for reading a data signal in response to being addressed. For this reason, it is important for all the column lines to be at the same potential during the reading process, in order to avoid parasitic currents in the memory cell array.

The operational amplifier circuit contained in the described read amplifier generally has an offset voltage, which is normally dependent on the technology. This means that the switching-on voltages and gate-source voltages of the input transistors are not precisely the same. In consequence, the potential of the respective column line is not accurately regulated at the reference potential provided. An offset voltage of even a few millivolts can cause parasitic currents in comparatively large memory cell arrays. These parasitic currents may be greater than a data signal or measurement signal to be read. Such a signal can in this case be corrupted such that it can no longer be detected.

SUMMARY OF THE INVENTION

The object of the present invention is to provide an integrated memory of the above-mentioned type which overcomes the deficiencies and disadvantages of the prior art devices and methods of this general kind, and wherein the data signal which is to be read can be detected comparatively reliably.

With the above and other objects in view there is provided, in accordance with the invention, an integrated memory, comprising:

- a memory cell array in form of a matrix having column lines and row lines;
- a plurality of memory cells with a magnetoresistive storage effect each connected between one of the column lines and one of the row lines;
- read amplifiers respectively connected to each column line for reading a data signal from a corresponding memory cell;
- the read amplifier having an operational amplifier with a feedback path, an output outputting a read signal, a first control input connected to one of the column lines, and a second control input; and
- a capacitor connected between the second control input of the operational amplifier and a supply potential.

In other words, the object is achieved by an integrated memory having memory cells with a magnetoresistive storage effect, having a memory cell array which is in the form of a matrix and has column lines and row lines, in which the memory cells are each connected between one of the column lines and one of the row lines, in which the column lines are each connected to a read amplifier for reading a data signal from a corresponding memory cell, in which the read amplifier has an operational amplifier with feedback, on which a read signal can be tapped off, in which a first control input of the operational amplifier is connected to one of the column lines, and in which a capacitor is connected between a second control input of the operational amplifier and a connection for a supply potential.

The integrated memory according to the invention makes it possible to avoid parasitic currents in the memory cell array when an offset voltage is present on an operational amplifier contained in the read amplifier. The integrated memory contains a circuit arrangement to compensate for any offset voltage which may be present. This circuit arrangement makes it possible to store any offset voltage which may be present in the operational amplifier in the capacitor which is connected between the second control input of the operational amplifier and the connection for the supply potential, for example a memory reference-ground potential. In consequence, the effect of the offset voltage of the operational amplifier can be canceled out by a voltage of the same magnitude on the capacitor. The potential of the respective column line at the first control input of the operational amplifier is thus regulated at the supply potential or reference-ground potential. In consequence, no parasitic currents can occur, which can corrupt a measurement signal to be read.

The potential applied to the capacitor can, for example, be adjusted in each read cycle. In order to read a data signal from a memory cell, all those row lines which are not selected are connected to the supply potential. A signal at a potential different to this is applied to the selected row line. This closes a current path from the selected row line to all the column lines. The resistance of that memory cell which is located at the intersection of the row line and the respective column line can be determined from the output signal from the respective read amplifier, the electrical characteristic variables of the read amplifier, the supply potential and the column line resistance. Once the output signal from the read amplifier has, possibly, been buffer-stored, assessed or processed further in some other general form by further circuit parts, the offset voltage can be adjusted once again. However, in this case, it is also possible not to buffer-store the offset voltage after each assessment process but to carry out adjustment only after a relatively large number of assessment processes in each case.

In accordance with an added feature of the invention, a first switch is connected between the first control input and a terminal for the supply potential; a second switch is connected in the feedback path of the operational amplifier; and a third switch is connected between an output of the operational amplifier and the second control input. There is an adjustment phase for adjusting the offset voltage, between two assessment processes. For this purpose, the second switch is opened in the adjustment phase, thus disconnecting the feedback of the operational amplifier. The first switch and the third switch are closed. This produces a closed control loop, which charges the capacitor with the offset voltage of the operational amplifier. For a subsequent assessment process, the first switch and the third switch are opened once again, the second switch is closed, and a data signal which is to be read is supplied to the read amplifier.

In accordance with an additional feature of the invention, the operational amplifier is an inverting amplifier, and an inversion circuit is connected between the output and the second control input of the operational amplifier. This means that the respective column line is connected to the inverting control input. In this case, an inversion circuit is connected between the output and the second control input of the operational amplifier. This results in the offset voltage to be stored in the capacitor having the correct polarity.

In accordance with another feature of the invention, there is a resistor connected in the feedback path of the operational amplifier. The operational amplifier with feedback in this case behaves as a current/voltage amplifier. In addition to or as an alternative to this, a further capacitor is connected in the feedback path. The operational amplifier with feedback in this case acts as an integrating current/voltage amplifier. This allows effective noise suppression to be achieved when reading a data signal.

In order to discharge the further capacitor during an adjustment phase, a fourth switch is connected in parallel with the further capacitor in the feedback path of the operational amplifier. During an adjustment phase, this switch is closed, and for an assessment process the fourth switch is opened.

Other features which are considered as characteristic for the invention are set forth in the appended claims. Although the invention is illustrated and described herein as embodied in an integrated memory having memory cells with a magnetoresistive storage effect, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
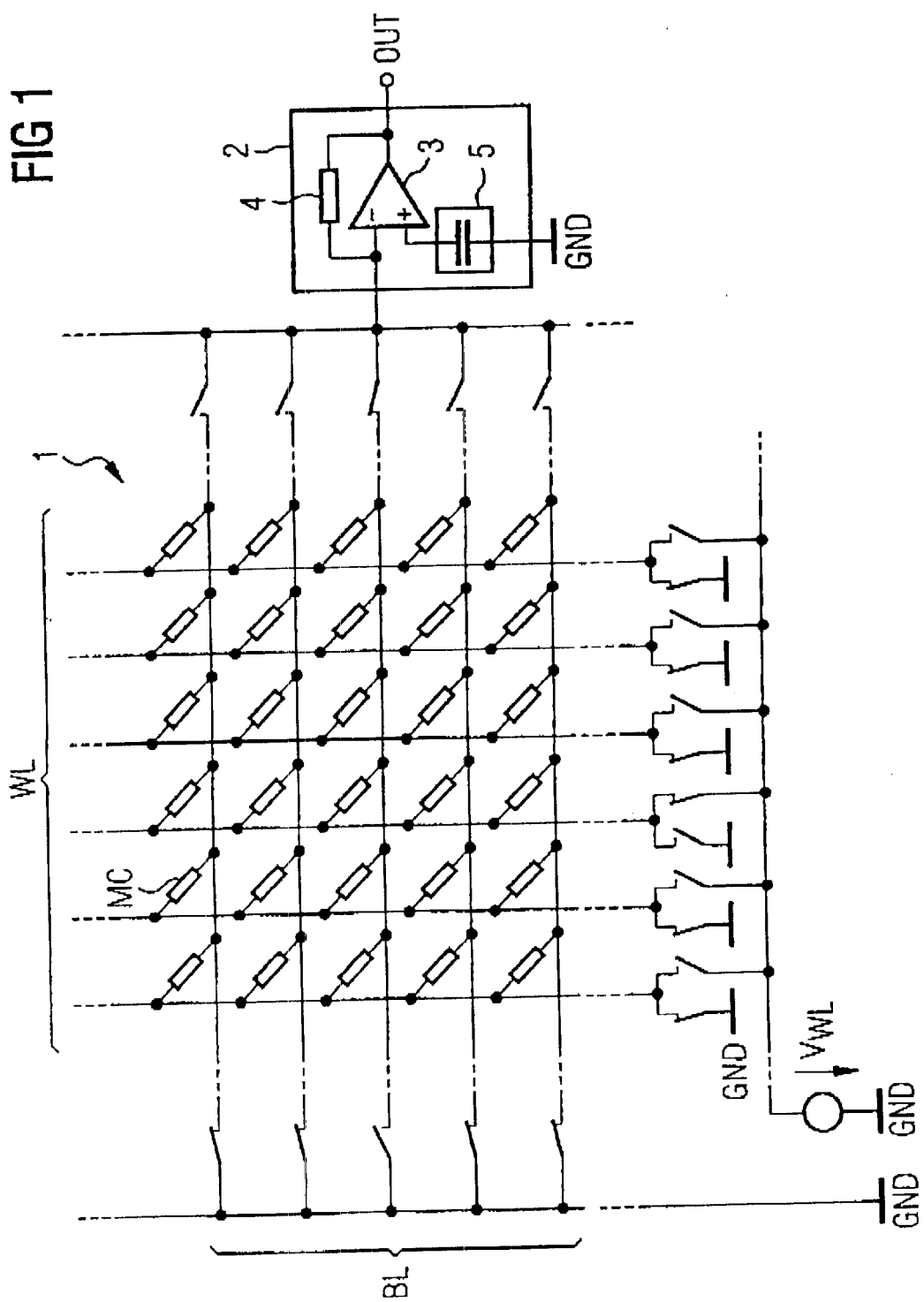
FIG. 1 is a schematic diagram of an embodiment of the memory according to the invention with magnetoresistive memory cells.

Referring now to the figures of the drawing in detail and first, particularly, to FIG. 1 thereof, there is seen one exemplary embodiment of a memory according to the invention having memory cells MC with a magnetoresistive storage effect. All known GMR/TMR elements are suitable for use as memory cells, provided they have a higher impedance than the column lines or bit lines BL and the row lines or word lines WL. The memory cells MC, which are arranged in a memory cell array 1 in the form of a matrix, are each connected between one of the bit lines BL and one of the word lines WL. In order to read a data signal from one of the memory cells MC, the corresponding bit line is connected to a read amplifier 2. The other bit lines BL are likewise connected to further read amplifiers or, as illustrated in FIG. 1, are connected to a connection for a reference-ground potential GND. The read amplifier 2 has an operational amplifier 3 with feedback, on which the read signal OUT can be tapped off.

The relevant word line WL is actuated in order to read the information stored in the memory cell configuration. For this purpose, the word line WL is connected to a potential $V_{WL}$. All the other word lines WL are connected to the reference-ground potential GND. In order to read the data signal, the relevant bit line BL is connected to the inverting input 31 of the operational amplifier 3. The capacitor 5 is connected between the non-inverting input 32 of the operational amplifier 3 and the connection for the reference-ground potential GND.

Figure 2:
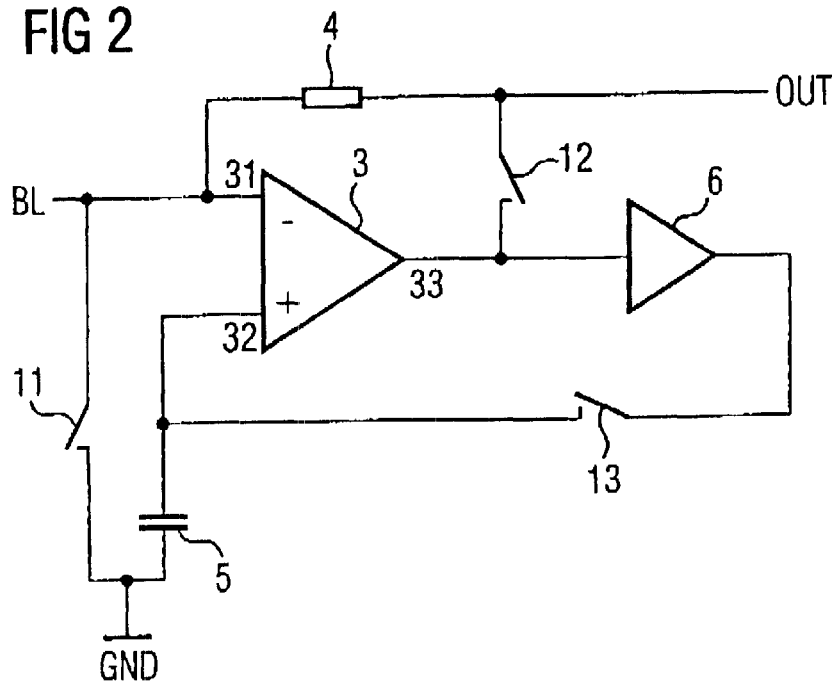
FIG. 2 is a schematic circuit diagram of one embodiment of a read amplifier.

Referring now to FIG. 2, there is shown one embodiment of the read amplifier 2 of FIG. 1. A switch 11 is connected between the inverting input 31 of the operational amplifier 3 and the connection for the reference-ground potential GND. A further switch 12 is connected in the feedback path of the operational amplifier 3. The output 33 of the operational amplifier 3 is connected via a switch 13 to the non-inverting input 32 of the operational amplifier 3. Furthermore, an inversion circuit 6 is connected between the output 33 and the non-inverting input 32 of the operational amplifier 3. The operational amplifier 3 has a feedback resistor 4, which is connected in the feedback path.

In order to compensate for the offset voltage of the operational amplifier 3, the offset voltage is stored in the capacitor 5 in an adjustment phase between two assessment processes. To this end, the switch 12 is opened, and the feedback of the operational amplifier 3 is thus disconnected. The switches 11 and 13 are closed. A closed control loop is produced via the inversion circuit 6, and the offset voltage at the input of the operational amplifier 3 charges the capacitor 5.

In order to read a data signal from one of the memory cells MC, the switches 11 and 13 are opened once again, and the switch 12 is closed. After completion of the reading process, adjustment can be carried out again, but it is also possible to carry out adjustment once again after a relatively large number of reading processes. One advantage of the circuit configuration shown in FIG. 2 is that the offset voltage is compensated for in a self-adjusting manner.

Figure 3:
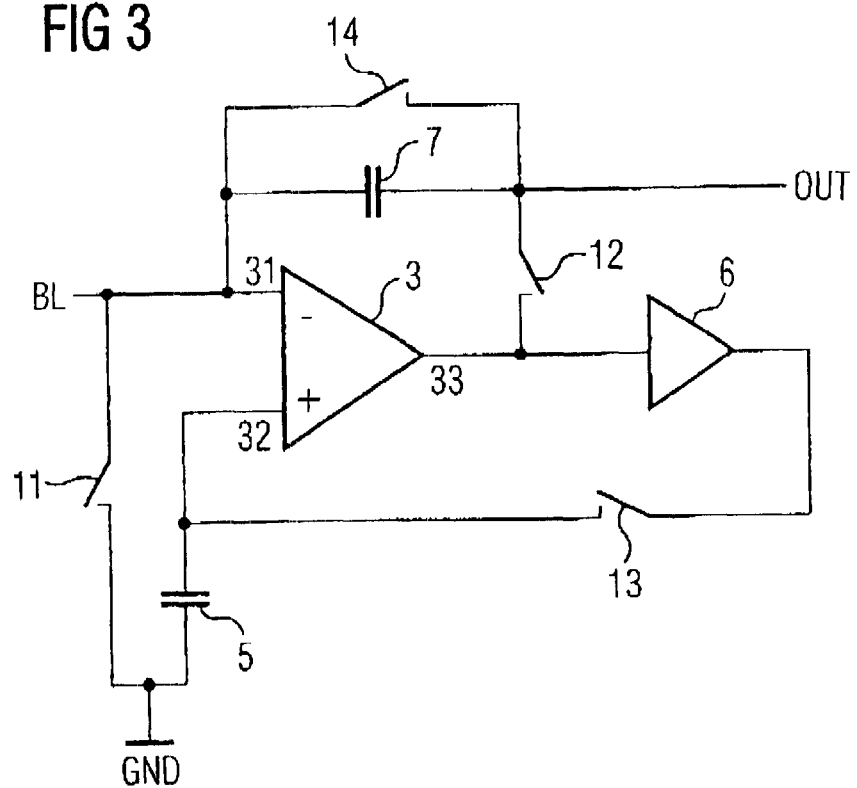
FIG. 3 is a similar view of a further embodiment of a read amplifier.

Referring now to FIG. 3, there is shown a further embodiment of the read amplifier 2 which, in this case, instead of the resistor 4, has a further capacitor 7 in the feedback path of the operational amplifier. A switch 14 is also connected in parallel with the capacitor 7 in the feedback path. The provision of the capacitor 7 in the feedback path allows a high level of noise suppression when reading a data signal, even for comparatively low signal strengths. During an adjustment phase, the switch 14 is closed in order to discharge the capacitor 7. During a reading process, the switch 14 is opened.

We claim:

1. An integrated memory, comprising:

a memory cell array in form of a matrix having column lines and row lines;

a plurality of memory cells with a magnetoresistive storage effect each connected between one of said column lines and one of said row lines;

read amplifiers respectively connected to each said column line for reading a data signal from a corresponding said memory cell;

said read amplifier having an operational amplifier with a feedback path, and outputting a read signal, said operational amplifier having a first control input connected to one of said column lines and a second control input; and a capacitor connected between said second control input of said operational amplifier and a supply potential.

2. The integrated memory according to claim 1, which further comprises:

a first switch connected between said first control input and a terminal for the supply potential;

a second switch connected in said feedback path of said operational amplifier; and a third switch connected between an output of said operational amplifier and said second control input.

3. The integrated memory according to claim 2, wherein said operational amplifier is an inverting amplifier, and an inversion circuit is connected between said output and said second control input of said operational amplifier.

4. The integrated memory according to claim 1, which comprises a resistor connected in said feedback path of said operational amplifier.

5. The integrated memory according to claim 1, which comprises a further capacitor connected in said feedback path of said operational amplifier.

6. The integrated memory according to claim 5, which comprises a switch connected in parallel with said further capacitor in said feedback path of said operational amplifier.

* * * * *